(12) United States Patent
Yamakawa

(10) Patent No.: US 7,370,266 B2
(45) Date of Patent: May 6, 2008

(54) DIGITAL SIGNAL DECODING DEVICE AND DIGITAL SIGNAL DECODING METHOD

(75) Inventor: Hideyuki Yamakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 826 days.

(21) Appl. No.: 10/740,531

(22) Filed: Dec. 22, 2003

(65) Prior Publication Data

US 2004/0133843 A1 Jul. 8, 2004

(30) Foreign Application Priority Data

Dec. 27, 2002 (JP) .............................. 2002-382260

(51) Int. Cl.
*H03M 13/03* (2006.01)
(52) U.S. Cl. ...................... 714/796; 714/794; 714/795; 714/792; 375/262; 375/341; 375/265
(58) Field of Classification Search ........ 714/792–796; 375/265, 262, 341
See application file for complete search history.

(56) References Cited

U.S. PATENT DOCUMENTS 5,040,211 A * 8/1991 Schreiber .................... 380/214
5,696,505 A   12/1997 Schouhamer Immink
5,870,471 A * 2/1999 Wootton et al. ............ 713/179

FOREIGN PATENT DOCUMENTS

| JP | 9-17130 | 1/1997 |
|---|---|---|
| JP | 10-22840 | 1/1998 |
| JP | 2755375 | 3/1998 |
| JP | 10-233702 | 9/1998 |

OTHER PUBLICATIONS

NN67041607: (A Class of Error Correcting Codes with Simple Encoders and Decoders; IBM Technical Disclosure Bulletin, vol. No. 9, pp. 1607-1612; Apr. 1967, US).*
de Almeida et al. (Two-Dimensional Interleaving Using the Set Partitioning Technique; IEEE, Aug. 1994).*
Inkyu Lee et al., "A New Architecture For The Fast Viterbi Algorithm," Global Telecommunications Conference 2000 GLOBECOM '00, vol. 3, 2000, pp. 1664-1668.

* cited by examiner

*Primary Examiner*—Guy J. Lamarre
(74) *Attorney, Agent, or Firm*—Pillsbury Winthrop Shaw Pittman, LLP

(57) ABSTRACT

A digital signal decoding device according to an aspect of the present invention is a digital signal decoding device for generating a binary code sequence by maximum likelihood estimation from a convolutionally encoded input signal sequence, includes an add-compare-select unit configured to compare only two metric values one unit time before the calculation time of a predetermined branch metric value calculated from the input signal sequence at two successive times at each time, to add the predetermined branch metric value to the two metric values independently of the compare process, to select one of the two sums in accordance with the comparison result of the two metric values, and to output the selected value as a metric value to be used at the next time.

5 Claims, 8 Drawing Sheets

DIGITAL SIGNAL DECODING DEVICE AND DIGITAL SIGNAL DECODING METHOD

CROSS-REFERENCE TO RELATED APPLICATIONS

This application is based upon and claims the benefit of priority from the prior Japanese Patent Application No. 2002-382260, filed Dec. 27, 2002, the entire contents of which are incorporated herein by reference.

BACKGROUND OF THE INVENTION

1. Field of the Invention

The present invention relates to a digital signal decoding device and digital signal decoding method, which are applied to a digital signal reproduction apparatus such as an optical disk apparatus or the like and, more particularly, to a digital signal decoding device and digital signal decoding method, which are applied to a signal reproduction circuit that exploits a PRML technique.

2. Description of the Related Art

As recording media that can record and reproduce digital data, optical disks represented by DVDs (Digital Versatile Disks) are known. A DVD-RAM as one of DVDs comprises a signal recording layer. When this recording layer is irradiated with a laser beam having appropriate energy, its crystal state changes. When the recording layer is irradiated with a laser beam of appropriate energy again, reflected light is obtained in a quantity corresponding to the crystal state of the recording layer. By detecting this reflected light, digital data recorded on the recording layer can be reproduced.

In recent years, a PRML technique is adopted to improve the recording density. Jpn. Pat. Appln. KOKAI Publication No. 9-17130 (reference 1) discloses the PRML technique. The contents of that technique will be briefly explained below.

Partial Response (PR) is a method of reproducing data while compressing a required signal band by positively utilizing intersymbol interference (interference between reproduction signals corresponding to bits which are recorded at neighboring positions). PR can be further categorized into a plurality of different classes depending on the way intersymbol interference is produced at that time. For example, in case of class 1, recorded data "1" is reproduced as 2-bit reproduction data "11", and intersymbol interference is produced for the subsequent 1 bit. A Viterbi decoding method (ML) is a kind of so-called maximum likelihood sequence estimation methods, and reproduces data on the basis of information of signal amplitudes at a plurality of times by effectively using the intersymbol interference rules of a reproduction waveform. For this process, synchronous clocks, which are synchronized with a reproduction waveform obtained from a recording medium, are generated, and the reproduction waveform itself is sampled using the clocks to be converted into amplitude information. After that, the amplitude information undergoes appropriate waveform equalization to be converted into a predetermined PR response waveform. A Viterbi decoder then outputs a maximum likely data sequence as reproduction data using old and current sample data. A combination of the aforementioned PR method and Viterbi decoding method (most likelihood decoding) is called a PRML method. PR can calculate a reproduction signal sequence by a convolution operation of an impulse response of a predetermined PR class with respect to a recorded data sequence. In other words, PR can express a process from recording to reproduction as an arbitrary finite state machine having N states ($N=2^{m-1}$ where m is the response length of the predetermined PR). A two-dimensional graph that expresses (N) states at arbitrary time k of this finite state machine as nodes which line up in the vertical direction, and expresses transition from the respective states to those at time (k+1) as branches is called a trellis diagram. A Viterbi algorithm is used to obtain a recorded signal sequence from a reproduction signal sequence, i.e., to find the shortest path on this trellis diagram, and is equivalent to a dynamic programming problem with respect to a multistage decision process. A Viterbi decoder based on this algorithm is used to make most likelihood estimation of a transmission sequence in bandlimited channels having intersymbol interference. That is, a code sequence that minimizes a distance metric (distance function) associated with a sequence of reception signals such as the sum total of square errors of the sequence of reception signals or the like is selected from possible code sequences. In order to put this PRML technique into practice, a high-precision adaptive equalization technique that obtains a reproduction signal as a response of a predetermined PR class, and a high-precision clock reproduction technique that supports the former technique are required.

A runlength limited code used in the PRML technique will be explained below. A PRML reproduction circuit generates clocks synchronized with a signal itself reproduced from a recording medium. In order to generate stable clocks, the polarity of a recorded signal must be inverted within a predetermined period of time. At the same time, the polarity of the recorded signal must be inhibited from being inverted during the predetermined period of time, so as to reduce the maximum frequency of the recorded signal. A maximum data length free from inversion of the polarity of the recorded signal is called a maximum runlength, and a minimum data length free from inversion of the polarity is called a minimum runlength. A modulation rule which has a maximum runlength of 8 bits and a minimum runlength of 2 bits is called (1, 7)RLL. Also, a modulation rule which has a maximum runlength of 8 bits and a minimum runlength of 3 bits is called (2, 7)RLL. As a typical modulation/demodulation method used in an optical disk, (1, 7)RLL and EFM Plus are known, and are disclosed in U.S. Pat. No. 5,696,505 (reference 2).

In recent years, the data reproduction speed of an optical disk apparatus and the like is increasing rapidly, and an operation speed of 500 MHz or higher is required. The consumption power of the data reproduction circuit increases in proportion to the operation speed. Also, an increase in recording linear density requires a PRML signal process of higher orders. Use of PRML of higher orders requires more complicated signal processes, and a larger-scale circuit. However, an optical disk apparatus with low consumption power is demanded due to prevalence of notebook type PCs, and the consumption power of a PRML reproduction circuit must be considerably reduced. Furthermore, a Viterbi decoder as a part of the PRML reproduction circuit bottlenecks an increase in processing speed since it executes feedback loop processes called ACS processes in addition to its complicated circuit.

In order to solve these problems, a technique that can simplify the circuit of a Viterbi decoder is disclosed in Jpn. Pat. No. 2,755,375 (reference 3). Furthermore, a technique that can improve the operation speed while suppressing an increase in circuit scale by adding a preload process called Radix-4 to the technique disclosed in this reference 3 is disclosed in Jpn. Pat. Appln. KOKAI Publication No. 10-22840 (reference 4). Furthermore, a technique that can improve the operation speed of a Viterbi decoder is disclosed in "A New architecture for the fast Viterbi algorithm", Inkyu Lee, Sonntag, J. L., Global Telecommunications Conference, 2000, GLOBECOM '00. IEEE, Volume: 3, 2000, pp. 1664-1668 (reference 5).

According to the technique disclosed in reference 3, a circuit can be simpler than a Viterbi decoder using the general Viterbi algorithm, but the operation speed cannot be improved.

According to the technique disclosed in reference 4, the preload process results in an increase in operation word length, and increases the consumption power beyond the improved processing speed.

Furthermore, according to the technique disclosed in reference 5, add and compare processes unique to the Viterbi algorithm can be parallelly executed, and the operation speed can be improved. However, the circuit complexity increases considerably due to the parallel processes, resulting in an increase in consumption power.

BRIEF SUMMARY OF THE INVENTION

A digital signal decoding device according to an aspect of the present invention is a digital signal decoding device for generating a binary code sequence by maximum likelihood estimation from a convolutionally encoded input signal sequence, comprising a calculation unit configured to calculate a branch metric value from the input signal sequence at two successive times at each time, and an add-compare-select unit configured to compare only two metric values one unit time before a calculation time of a predetermined branch metric value, to add the predetermined branch metric value to the two metric values independently of the compare process, to select one of the two sums in accordance with the comparison result of the two metric values, and to output the selected value as a metric value to be used at the next time.

A digital signal decoding method according to an aspect of the present invention is a digital signal decoding method for generating a binary code sequence by maximum likelihood estimation from a convolutionally encoded input signal sequence, comprising: comparing only two metric values one unit time before a calculation time of a predetermined branch metric value calculated from the input signal sequence at each time, adding the predetermined branch metric value to the two metric values independently of the compare process, selecting one of the two sums in accordance with the comparison result of the two metric values, and outputting the selected value as a metric value to be used at the next time.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below serve to explain the principles of the invention.

DETAILED DESCRIPTION OF THE INVENTION

An embodiment of the present invention will be described hereinafter with reference to the accompanying drawings.

A Transformed Viterbi algorithm will be described first. This algorithm transforms a trellis diagram into that which is modified by shifting metric operations associated with sample data at respective times outside metric comparison and path selection operations on the trellis diagram, and comprises (a) a step of selecting survival paths that reach respective states at the next time by comparing the difference between the metrics of nodes at the current time and a given value irrespective of a recursive step, and (b) a step of adding shifted branch metrics at each node.

Figure 5:
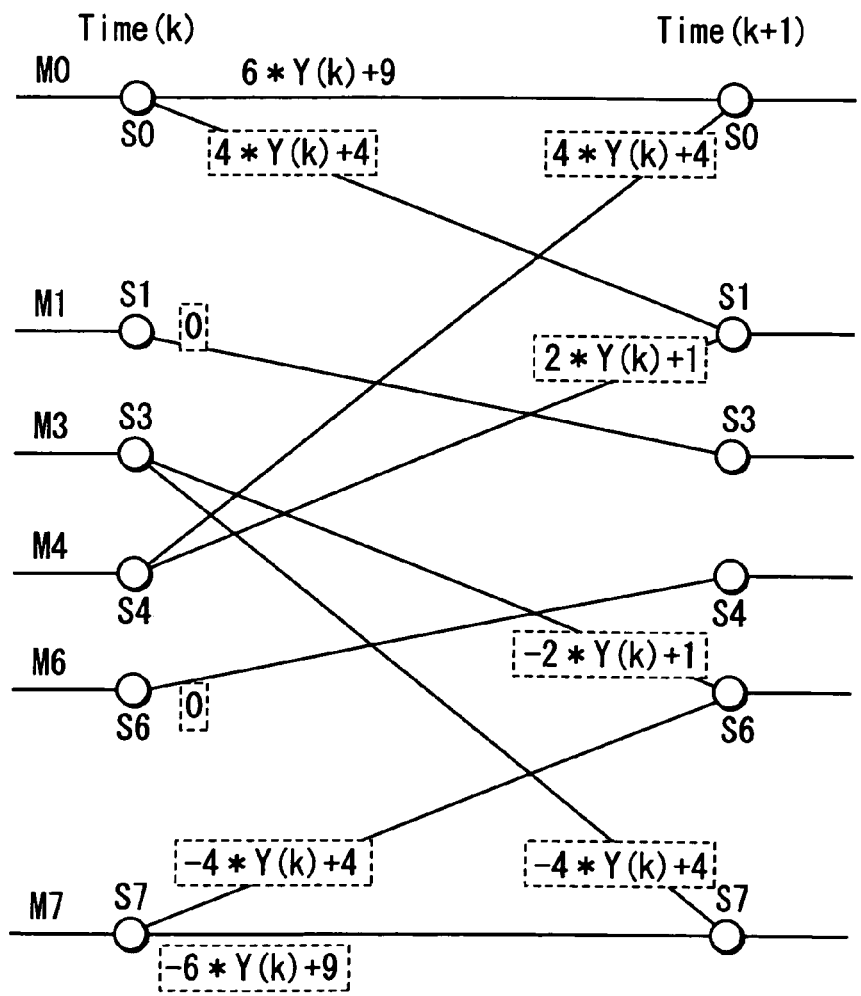
FIG. 5 shows a trellis diagram corresponding to PR(1221)

For example, a normal Viterbi decoder which has an impulse response of a channel=(1221) and uses a (1, 7)RLL code will be described below using FIGS. 5 and 6. FIG. 5 shows a normal trellis diagram corresponding to PR(1221). When a (1, 7)RLL code is used in PR(1221), the number of internal states is six. Let S0, S1, S3, S4, S6, and S7 be these internal states. Also, let $\{-3, -2, -1, 0, 1, 2, 3\}$ be the ideal channel output amplitude values, and Y(k) be the actual channel output amplitude at time k. Furthermore, let M0 be the metric of a path which reaches state S0 at time k, M1 be the metric of a path which reaches state S1, M3 be the metric of a path which reaches state S3, M4 be the metric of a path which reaches state S4, M6 be the metric of a path which reaches state S6, and M7 be the metric of a path which reaches state S7. Upon transition from time k to time k+1, state S0 branches to states S0 and S1, state S1 reaches state S3, state S3 branches to states S6 and S7, state S4 branches to states S0 and S1, state S6 reaches state S4, and state S7 branches to states S6 and S7. Most likelihood paths to be selected of those which reach respective states at time k+1 and the metric values of respective states at time k+1 are determined according to the following formulas:

If $M0(k)+(Yk+3)^2 < M4(k)+(Yk+2)^2$, $S0(k) \rightarrow S0(k+1)$ is selected.

$M0(k+1)=M0(k)+(Yk+3)^2-Yk^2$

If $M0(k)+(Yk+3)^2>=M4(k)+(Yk+2)^2$, $S4(k)\to S0(k+1)$ is selected.

$M0(k+1)=M4(k)+(Yk+2)^2-Yk^2$

If $M0(k)+(Yk+2)^2<M4(k)+(Yk+1)^2$, $S0(k)\to S1(k+1)$ is selected.

$M1(k+1)=M0(k)+(Yk+3)^2-Yk^2$

If $M0(k)+(Yk+3)^2>=M4(k)+(Yk+2)^2$, $S4(k)\to S0(k+1)$ is selected.

$M1(k+1)=M4(k)+(Yk+2)^2-Yk^2$

If $M3(k)+(Yk-1)^2<M7(k)+(Yk-2)^2$, $S3(k)\to S6(k+1)$ is selected.

$M6(k+1)=M3(k)+(Yk-1)^2-Yk^2$

If $M3(k)+(Yk-1)^2>=M7(k)+(Yk-2)^2$, $S7(k)\to S6(k+1)$ is selected.

$M6(k+1)=M7(k)+(Yk-2)^2-Yk^2$

If $M3(k)+(Yk-2)^2<M7(k)+(Yk-3)^2$, $S3(k)\to S7(k+1)$ is selected.

$M7(k+1)=M3(k)+(Yk-2)^2-Yk^2$

If $M3(k)+(Yk-2)^2>=M7(k)+(Yk-3)^2$, $S7(k)\to S7(k+1)$ is selected.

$M7(k+1)=M7(k)+(Yk-3)^2-Yk^2$

The following path selection and metric update are unconditionally made.

$S1(k)\to S3(k+1)$ is selected.

$M3(k+1)=M1(k)+(Yk)^2-Yk^2$ $S6(k)\to S4(k+1)$ is selected.

$M4(k+1)=M6(k)+(Yk)^2-Yk^2$

By executing the comparison/selection processes at each time, the Viterbi decoder obtains a most likelihood sequence.

FIG. 5 is a trellis diagram showing the aforementioned processing flow. There are two paths that reach state S0 at time k+1, i.e., transition from state S0 at time k, and transition from state S4 at time k. The likelihoods of these two paths are respectively M0+6*Y(k)+9 and M4+4*Y(k)+4 as the sums obtained by adding the likelihoods of respective transition paths (branches) to metrics M0 and M4 as likelihoods at time k. By comparing these likelihoods, the likelihood with a smaller value is determined as metric M0 of state S0 at time (k+1).

Likewise, there are two paths that reach state S1 at time k+1, i.e., transition from state S0 at time k and transition from state S4 at time k. The likelihoods of these two paths are respectively M0+4*Y(k)+4 and M4+2*Y(k)+1 as the sums obtained by adding the likelihoods (branch metrics) of respective transition paths (branches) to metrics M0 and M4 as likelihoods at time k. By comparing these likelihoods, the likelihood with a smaller value is determined as metric M1 of state S1 at time (k+1).

Also, there is only one path that reaches state S3 at time k+1, i.e., transition from state S1 at time k. Hence, metric M3 at time k+1 is M1+0 obtained by adding the branch metric of the transition from state S1 to state S3 to M1.

Likewise, there is only one path that reaches state S4 at time k+1, i.e., transition from state S6 at time k. Hence, metric M4 at time k+1 is M6+0 obtained by adding the branch metric of the transition from state S6 to state S4 to M6.

There are two paths that reach state S6 at time k+1, i.e., transition from state S3 at time k and transition from state S7 at time k. The likelihoods of these two paths are respectively M3−2*Y(k)+1 and M7−4*Y(k)+4 as the sums obtained by adding the likelihoods of respective transition paths (branches) to metrics M3 and M7 as likelihoods at time k. By comparing these likelihoods, the likelihood with a smaller value is determined as metric M6 of state S6 at time (k+1).

Similarly, there are two paths that reach state S7 at time k+1, i.e., transition from state S3 at time k and transition from state S7 at time k. The likelihoods of these two paths are respectively M3−4*Y(k)+4 and M7−6*Y(k)+6 as the sums obtained by adding the likelihoods of respective transition paths (branches) to metrics M3 and M7 as likelihoods at time k. By comparing these likelihoods, the likelihood with a smaller value is determined as metric M7 of state S7 at time (k+1).

The operation contents at respective times of the Viterbi decoder that executes the aforementioned processes can be separated into the following three steps if they are summarized for a case that reaches state S0.

(1) Add

M0+6*Y(k)+9

M4+4*Y(k)+4

These two operations are independent, and can be parallelly processed.

(2) Compare

M0+6*Y(k)+9:M4+4*Y(k)+4

The values obtained by the first process are compared.

(3) Select

If $M0+6*Y(k)+9<M4+4*Y(k)+4$ $M0(k+1)=M0+6*Y(k)+9$

If $M0+6*Y(k)+9>=M4+4*Y(k)+4$ $M0(k+1)=M4+4*Y(k)+4$

One of the results of the first process (add) is selected in accordance with the result of the second process (compare).

The aforementioned three processes so-called ACS processes are required. As can be seen from the above description, these three processes must be executed in turn, and bottleneck the processing speed for high-speed transfer. The outline of the normal Viterbi decoding process has been explained.

A Transformed Viterbi algorithm will be described below. This algorithm arranges similar operations by changing the operation order, thereby simplifying the whole process. Details of this algorithm will be described below taking a 2-state trellis shown in FIGS. 8, 9, and 10 as an example.

Figure 8:
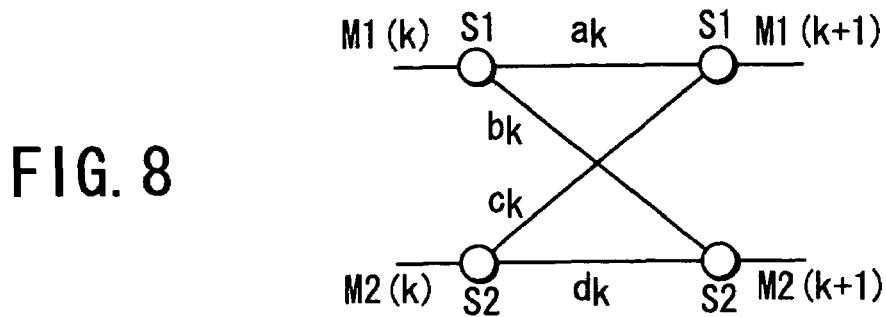
FIG. 8 shows a symmetrical 2-state butterfly trellis diagram.

FIG. 8 shows a normal 2-state trellis diagram (symmetric 2-state butterfly trellis). The basic structure of this trellis is the same as the trellis diagram of FIG. 6. In FIG. 8, M1(k) and M2(k) are metrics that represent the likelihoods of two states at time k. The weight (branch metric) of transition from state S1 to state S1 is ak, the weight (branch metric) of transition from state S1 to state S2 is bk, the weight (branch metric) of transition from state S2 to state S1 is ck, and the weight (branch metric) of transition from state S2 to state S2 is dk. In FIG. 8, metrics M1(k+1) and M2(k+1) at time (k+1) are respectively calculated by:

$$M1(k+1)=\text{Min }[M1(k)+ak, M2(k)+ck]$$

$$M2(k+1)=\text{Min }[M1(k)+bk, M2(k)+dk]$$

Figure 9:
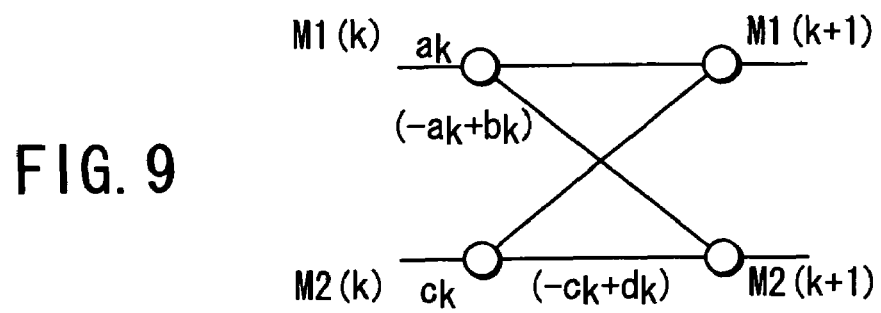
FIG. 9 is a diagram showing a left shift addition of branch metrics.

In these operations, branch metrics ak and ck can be arranged, as shown in FIG. 9. That is, $$M1(k+1)=\text{Min }[M1(k)+ak, M2(k)+ck]$$

$$M2(k+1)=\text{Min }[M1(k)+ak+(-ak+bk), M2(k)+ck+(-ck+dk)]$$

Figure 10:
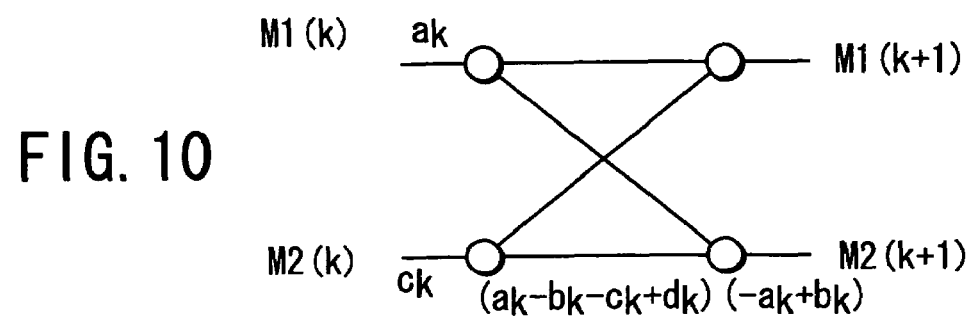
FIG. 10 is a diagram showing a right shift addition of branch metrics on maximum/minimum nodes.

Furthermore, branch metrics bk and dk can be arranged, as shown in FIG. 10. That is, $$M1(k+1)=\text{Min }[M1(k)+ak, M2(k)+ck]$$

$$M2(k+1)=\text{Min }[M1(k)+ak+(-ak+bk), M2(k)+ck+(-ck+dk)]$$

Figure 11:
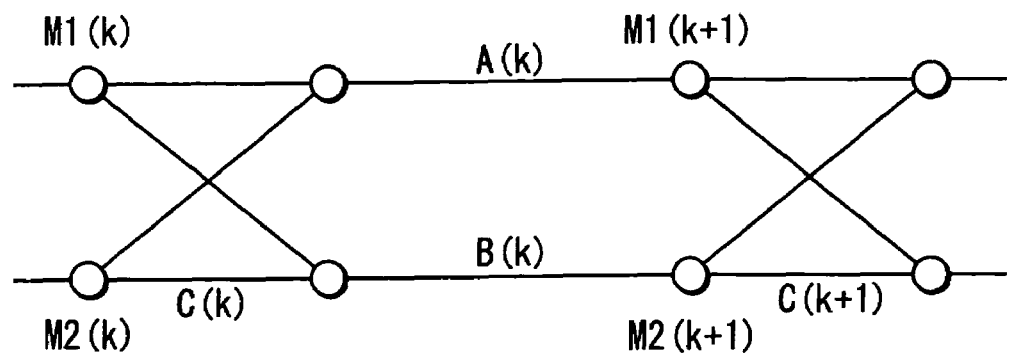
FIG. 11 shows a twice-repeated trellis diagram formed by shifting branch metrics.

With such modifications, since the M1 select process does not require any weights of branches, the process can be simplified. FIG. 11 is a diagram for explaining a case wherein the process in FIG. 10 is repeated a plurality of number of times. In FIG. 11, operations that computes metrics at time (k+1) are respectively described by:

$$M1(k+1)=\text{Min }[M1(k), M2(k)]+A(k)$$

$$M2(k+1)=\text{Min }[M1(k), M2(k)+C(k)]+B(k)$$

for $$A(k)=a_{k+1}$$

$$B(k)=(-a_k+b_k)+c_{k+1}$$

$$C(k)=(a_k-b_k-c_k+d_k)$$

Since operations that compute A(k), B(k), and C(k) can be parallelly executed independently of the Compare-Select processes, the process can be simplified. The outline of the Transformed Viterbi algorithm has been explained.

Figure 6:
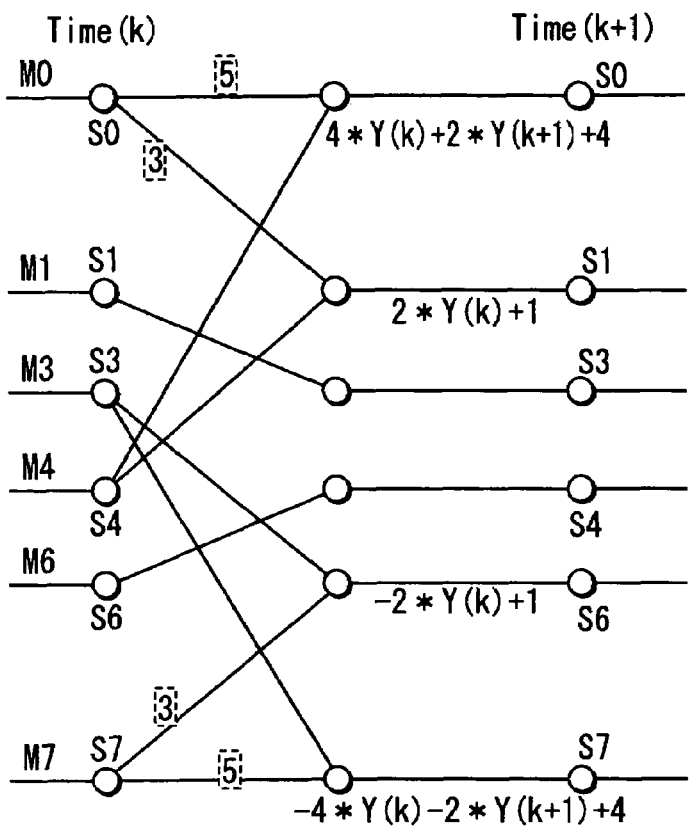
FIG. 6 shows a Transformed trellis diagram corresponding to PR(1221)

FIG. 6 is a trellis diagram showing an example wherein such Transformed Viterbi algorithm is applied to the aforementioned case of PR(1221). In this diagram, S0, S1, S3, S4, S6, and S7 represent six states corresponding to PR(1221), and M0, M1, M3, M4, M6, and M7 are metrics that reach the respective states. In FIG. 6, the metrics of the respective states at time (k+1) are respectively calculated by:

$$M0(k+1)=\text{Min }[M0(k)+5, M4(k)]+4*Y(k)+2*Y(k+1)+4$$

$$M1(k+1)=\text{Min }[M0(k)+3, M4(k)]+2*Y(k)+1$$

$$M3(k+1)=M1(k)$$

$$M4(k+1)=M6(k)$$

$$M6(k+1)=\text{Min }[M3(k), M7(k)+3]-2*Y(k)+1$$

$$M7(k+1)=\text{Min }[M3(k), M7(k)+5]-4*Y(k)-2*Y(k+1)+4$$

In the above operations, since the Compare-Select process can be implemented by operations of only the previous metric values and constants, the circuit can be greatly simplified. However, since a critical path as a constraint of the processing time of each cycle is still constant Add—Compare—Select, the processing speed is not so improved compared to the arrangement shown in FIG. 5.

Figure 12:
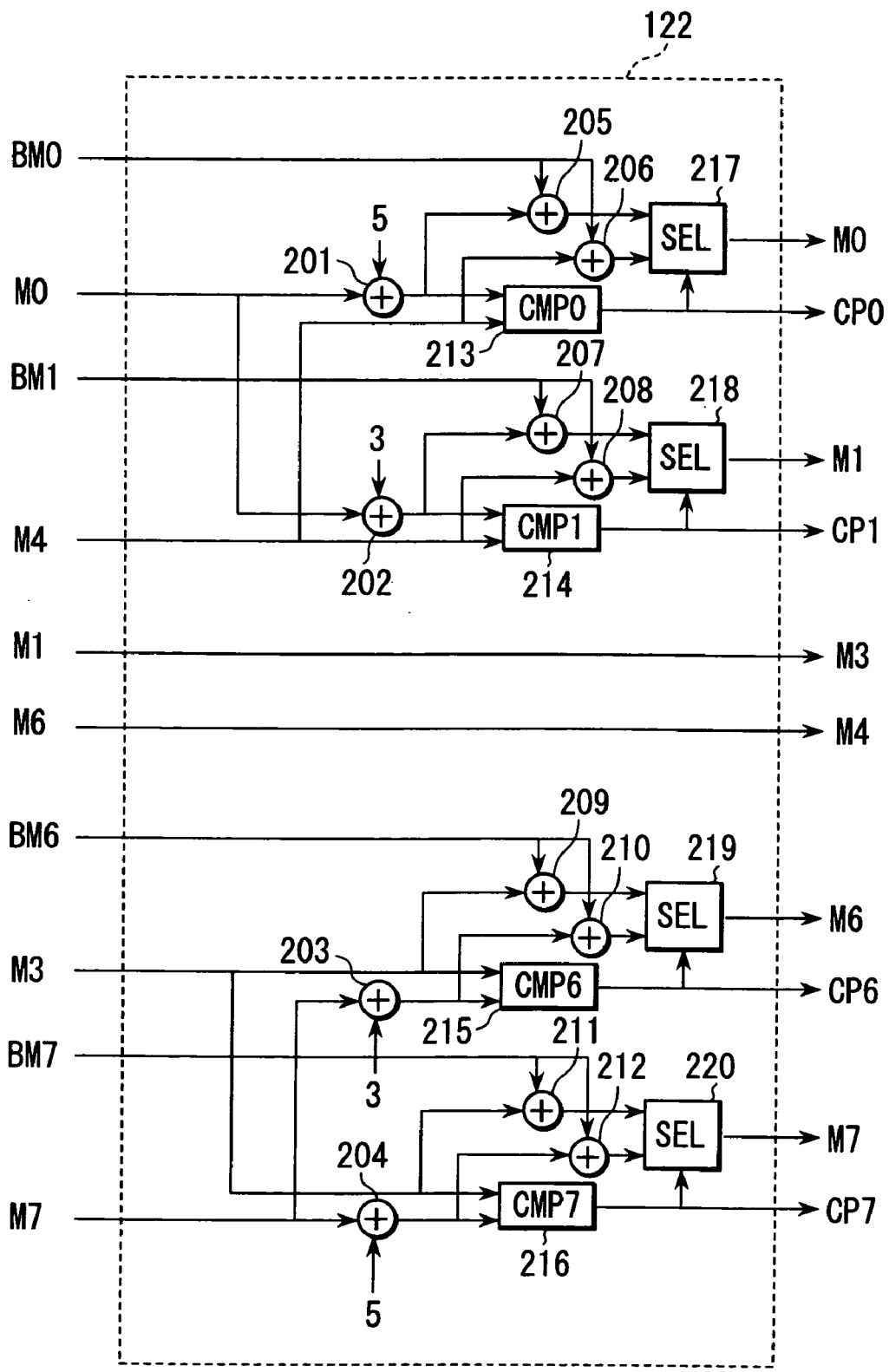
FIG. 12 is a block diagram showing an example of the structure of an ACS unit of a Transformed Viterbi decoder corresponding to PR(1221)

FIG. 12 is a block diagram showing hardware which implements the ACS processes based on the trellis diagram shown in FIG. 6. In FIG. 12, reference symbols S0, S1, S3, S4, S6, and S7 denote states as in those of FIG. 6. Reference symbols M0, M1, M3, M4, M6, and M7 denote metric values as in those in FIG. 6. M0, M1, M3, M4, M6, and M7 on the left side of FIG. 12 indicate metric values determined at the previous time, and those on the right side in FIG. 12 are new metric values determined by the ACS processes. Also, BM0, BM1, BM6, and BM7 are the weights of branches which are arranged on the right side on the trellis diagram of FIG. 6, and are respectively given by:

$$BM0=4*Y(k)+2*Y(k+1)+4$$

$$BM1=2*Y(k)+1$$

$$BM6=-2*Y(k)+1$$

$$BM7=-4*Y(k)-2*Y(k+1)+4$$

As shown in FIG. 12, an ACS unit of the Viterbi decoder comprises adders 201 to 212, comparators 213 to 216, and selectors 217 to 220.

The adder 201 calculates the sum of metric M0 and constant "5". The comparator 213 compares the sum from the adder 201 with the value of metric M4. At the same time, the adder 205 adds the output from the adder 201 and BM0, and the adder 206 adds metric M4 and BM0. If the first input value of the comparator 213 is smaller than its second input value, the selector 217 selects its first input; if the first input value of the comparator 213 is larger than its second input value, the selector 217 selects its second input. For example, if the comparison result of the comparator 213 is [M0+5<M4], the output from the selector 217 is the output from the adder 205. Conversely, if the comparison result of the comparator 213 is [M0+5>=M4], the output from the selector 217 is the output from the adder 206. The result selected in this manner is used as metric M0 at the next time.

Likewise, the adder 202 calculates (M0+3). The comparator 214 compares (M0+3) with the value of M4. At the same time, the adder 207 adds the output from the adder 202 and BM1, and the adder 208 adds metric M4 and BM1. If the first input value of the comparator 214 is smaller than its second input value, the selector 218 selects its first input; if the first input value of the comparator 214 is larger than its second input value, the selector 218 selects its second input. For example, if the comparison result of the comparator 214 is [M0+3<M4], the selector 218 selects the output from the adder 207. Conversely, if the comparison result of the comparator 214 is [M0+3>=M4], the selector 218 selects the output from the adder 208.

Also, the adder 203 calculates (M7+3). The comparator 215 compares (M7+3) with the value of M3. At the same time, the adder 209 adds metric M3 and BM6, and the adder 210 adds the output from the adder 203 and BM6. If the first input value of the comparator 215 is smaller than its second input value, the selector 219 selects its first input; if the first input value of the comparator 215 is larger than its second input value, the selector 219 selects its second input. For example, if the comparison result of the comparator 215 is [M7+3<=M3], the selector 219 selects the output from the adder 210. Conversely, if the comparison result of the comparator 215 is [M7+3>M3], the selector 219 selects the output from the adder 209.

Likewise, the adder 204 calculates (M7+5). The comparator 216 compares (M7+5) with the value of M3. At the same time, the adder 211 adds metric M3 and BM7, and the adder 211 adds the output from the adder 204 and BM7. If the first input value of the comparator 216 is smaller than its second input value, the selector 220 selects its first input; if the first input value of the comparator 216 is larger than its second input value, the selector 220 selects its second input. For example, if the comparison result of the comparator 216 is [M7+5<=M3], the selector 220 selects the output from the adder 212. Conversely, if the comparison result of the comparator 216 is [M7+5>M3], the selector 220 selects the output from the adder 211.

In this way, the ACS processes corresponding to the Transformed Viterbi algorithm are implemented.

Figure 7:
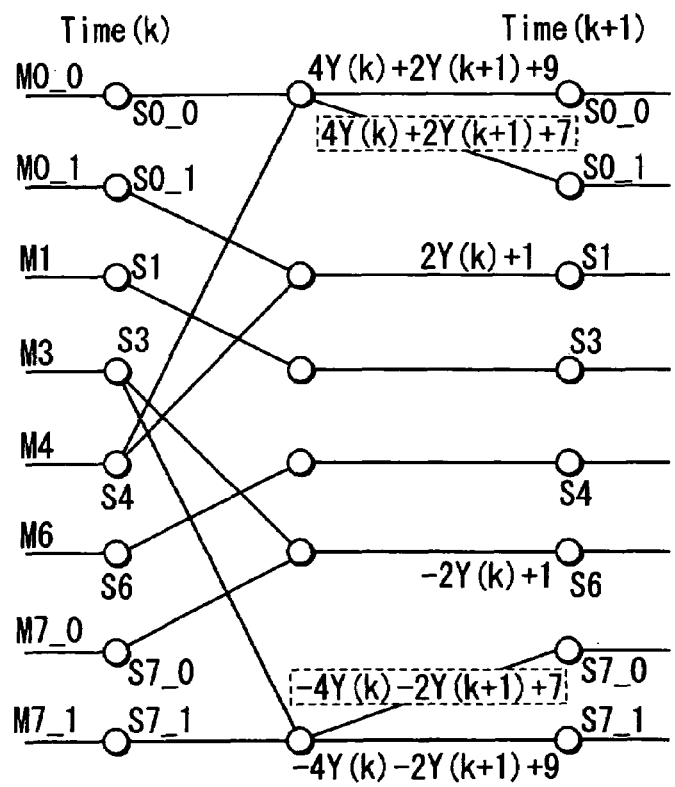
FIG. 7 shows a trellis diagram corresponding to PR(1221) according to an embodiment of the present invention.

A Viterbi decoding process according to the present invention as an improved version of the aforementioned Transformed Viterbi algorithm will be explained below. The present invention uses a Double State Viterbi algorithm in combination with the Transformed Viterbi algorithm. If a branch on a trellis diagram has a weight, that branch is divided into a plurality of branches to obviate the need for a prior add process at a branch that merges all branches. FIG. 7 shows a practical example using the trellis diagram corresponding to PR(1221) as in the above examples. Operations for computing metric values at time (k+1) upon using the fast Viterbi algorithm according to the present invention are respectively described by:

$$M0\_0(k+1) = \text{Min } [M0\_0(k), M4(k)] + 4*Y(k) + 2*Y(k=1) + 9$$

$$M0\_1(k+1) = \text{Min } [M0\_0(k), M4(k)] + 4*Y(k) + 2*Y(k=1) + 7$$

$$M1(k+1) = \text{Min } [M0\_1(k), M4(k)] + 2*Y(k) + 1$$

$$M3(k+1) = M1(k)$$

$$M4(k+1) = M6(k)$$

$$M6(k+1) = \text{Min } [M3(k), M7\_0(k)] - 2*Y(k) + 1$$

$$M7\_0(k+1) = \text{Min } [M3(k), M7\_1(k)] - 4*Y(k) - 2*Y(k+1) + 7$$

$$M7\_1(k+1) = \text{Min } [M3(k), M7\_1(k)] - 4*Y(k) - 2*Y(k+1) + 9$$

In the aforementioned processes, since all compare and select equations do not have any portions depending on a sample value (Y(k)) at each time, the processes can be parallelly executed independently of the branch metric operations. Also, the branch metric operations are simplified by commonizing operations unique to the Transformed Viterbi algorithm.

Figure 2:
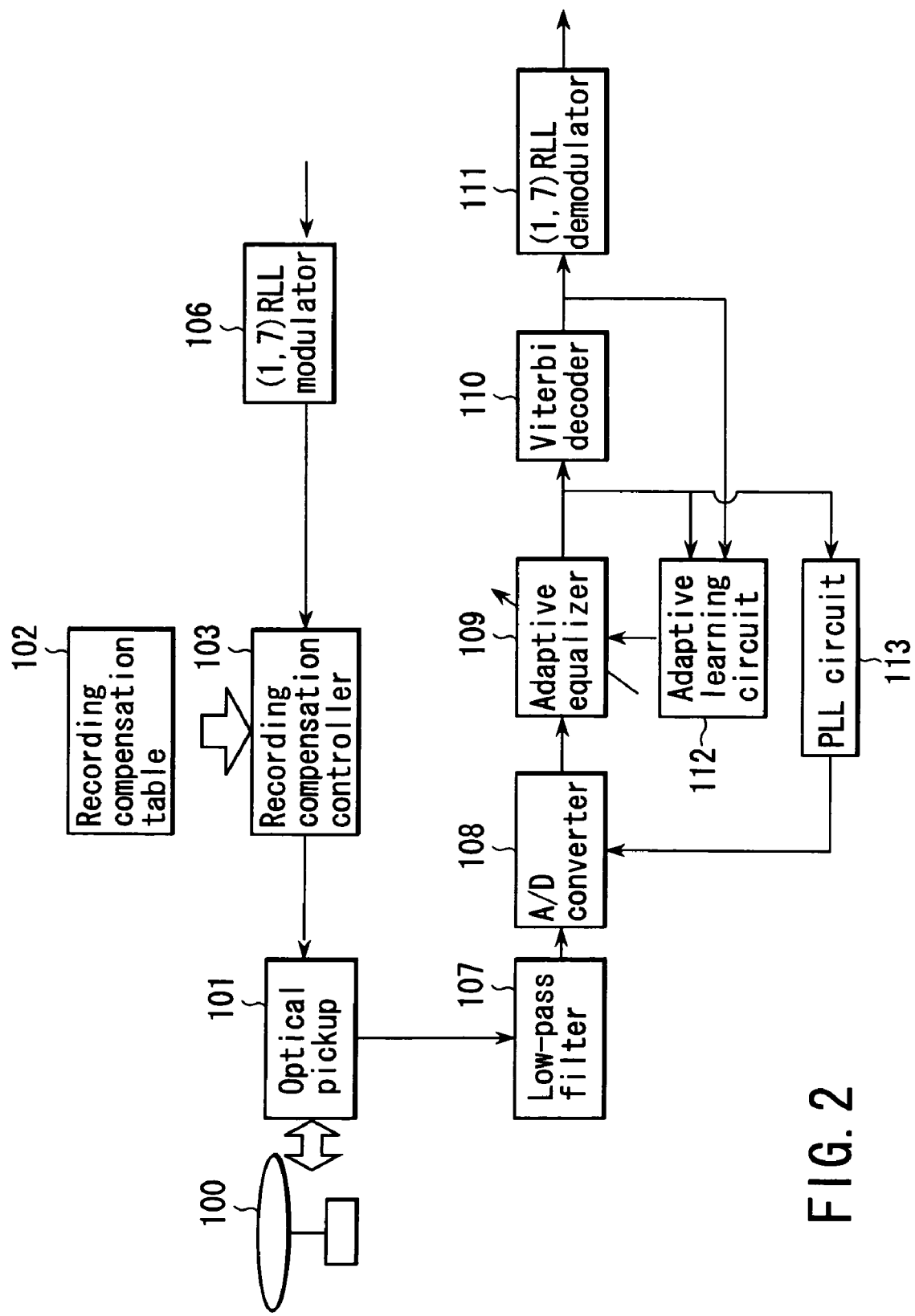
FIG. 2 is a block diagram showing the arrangement of a recording/reproduction circuit to which a Viterbi decoder that comprises the Add-Compare-Select unit according to an embodiment of the present invention is applied.

FIG. 2 shows the arrangement of a recording/reproduction circuit according to the present invention. As shown in FIG. 2, the recording/reproduction circuit comprises an optical pickup 101, recording compensation table 102, recording compensation controller 103, (1, 7)RLL modulator 106, low-pass filter 107, A/D converter 108, adaptive equalizer 109, Viterbi decoder 110, demodulator 111, adaptive learning circuit 112, and PLL circuit 113.

The operation of the circuit will be described below together with those in recording and reproduction modes of the recording/reproduction circuit. The (1, 7)RLL modulator 106 modulates recording data to meet a (1, 7)RLL runlength limitation. The recording compensation controller 103 generates recording pulses at appropriate timings with reference to the recording compensation table 102 in response to the individual runlengths of recording data generated by the modulator 106. The recording pulses generated by the recording compensation controller 103 are converted into optical signals by the optical pickup 101, and an optical disk 100 is irradiated with these optical signals. On the optical disk 100, the crystal state of a recording layer changes in correspondence with the intensity of irradiated light. A series of operations in a data recording mode have been explained.

The operations in a data reproduction mode will be explained below. The optical pickup 101 emits a laser beam with an appropriate intensity, which strikes the optical disk 100. In response to this laser beam, light with an intensity corresponding to recorded data is reflected by the optical disk 100. The optical pickup 101 detects this reflected light and outputs an electrical signal corresponding to the amount of the reflected light. This electrical signal undergoes appropriate band limitation in the low-pass filter 107. The output signal from the low-pass filter 107 is converted into a digital signal by the A/D converter 108. The output signal from the A/D converter 108 undergoes waveform equalization in the adaptive equalizer 109 to obtain a response waveform corresponding to a target PR class. The equalization characteristics at that time are adjusted by the adaptive learning circuit 112. The Viterbi decoder 110 checks if the output from the adaptive equalizer 109 is data '1' or '0', and obtains binary data. The obtained binary data undergoes a process (demodulation) opposite to (1, 7)RLL modulation in the demodulator 111, thus obtaining the recorded data. Simultaneously with these operations, the PLL circuit 113 controls sampling clocks in accordance with the output from the adaptive equalizer 109 to set appropriate sampling timings in the A/D converter 108.

Figure 3:
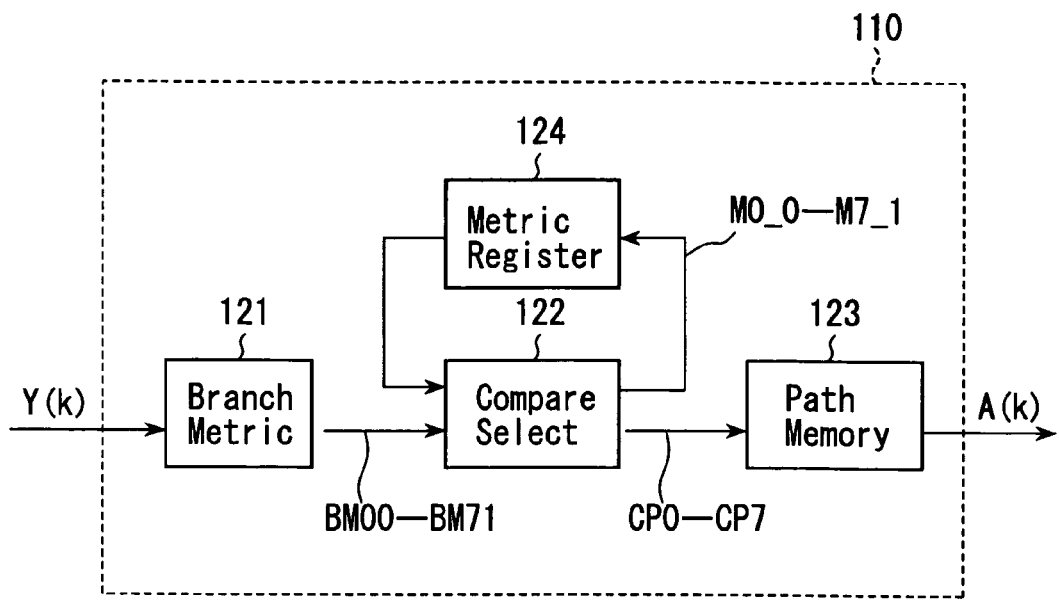
FIG. 3 is a block diagram showing the arrangement of the Viterbi decoder which comprises the Add-Compare-Select unit according to an embodiment of the present invention.

The internal arrangement of the Viterbi decoder 100 will be explained below using FIG. 3. As shown in FIG. 3, the Viterbi decoder 100 comprises four blocks, i.e., a branch metric operating unit 121, compare-select unit 122, metric register 124, and path memory 123.

The branch metric operating unit 121 computes branch metric BM00-BM71 from output signals Y(k) and Y(k+1) from the adaptive equalizer 109 at two successive times. In case of PR(1221) mentioned above, the operations of the branch metric operating unit 121 are described by:

$$BM00 = 4*Y(k) + 2*Y(k+1) + 9$$

$$BM01 = 4*Y(k) + 2*Y(k+1) + 7$$

$$BM1 = 2*Y(k) + 1$$

$$BM6 = -2*Y(k) + 1$$

$$BM70 = -4*Y(k) - 2*Y(k+1) + 7$$

$$BM71 = -4*Y(k) - 2*Y(k+1) + 9$$

The metric register 124 holds the minimum metric value calculated at each time, which is used in the compare-select process at the next time. At the same time, the metric register 124 executes a process for avoiding an overflow of the metric value.

Figure 4:
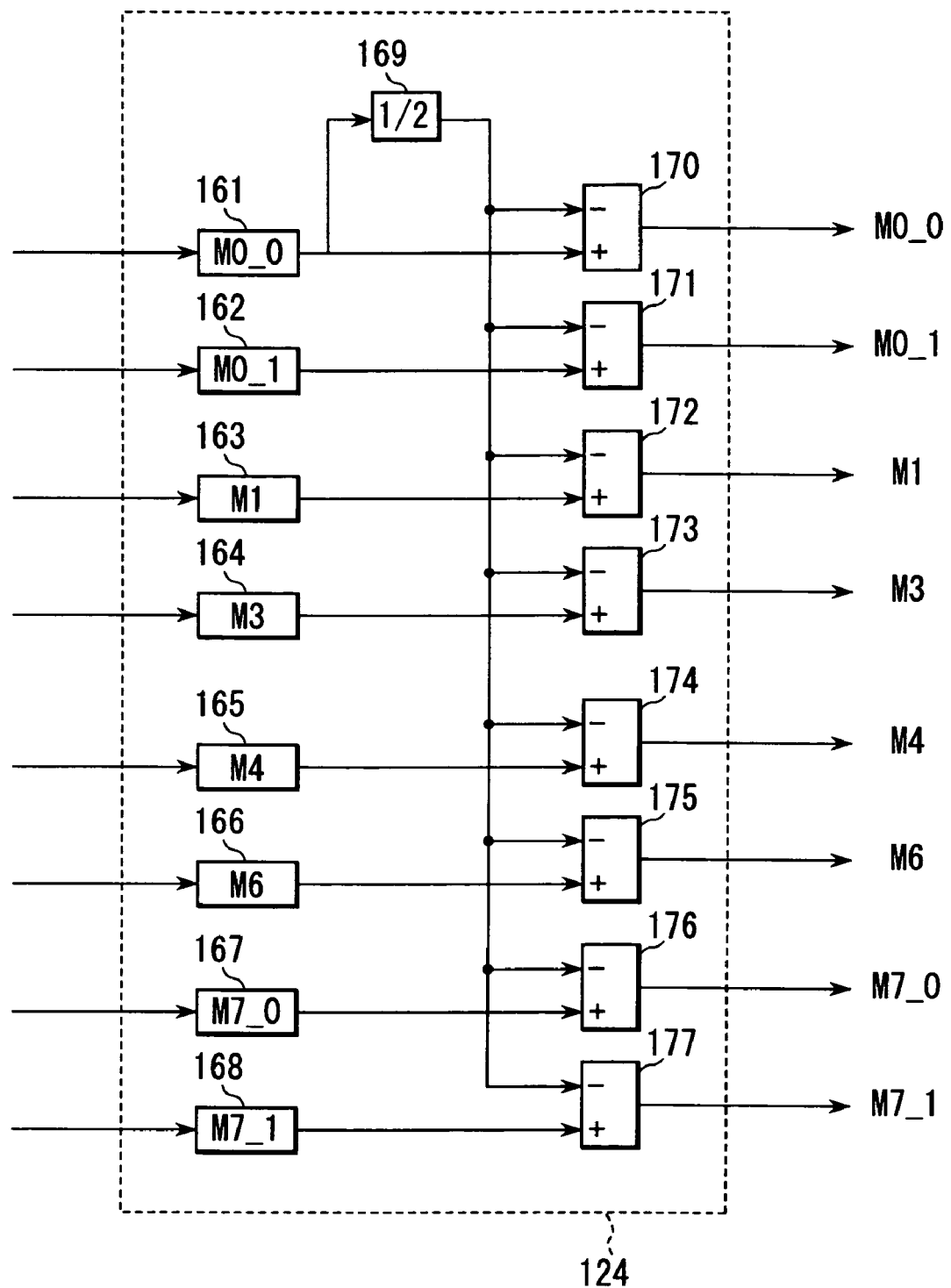
FIG. 4 is a block diagram showing the arrangement of a metric register according to an embodiment of the present invention.

FIG. 4 shows an example of the arrangement of the metric register 124. As shown in FIG. 4, the metric register 124 comprises flip-flops 161 to 168, shift circuits 169, and adders 170 to 177. The flip-flops 161 to 168 hold metric values obtained by the compare-select unit 122 at respective times. The shift circuit 169 halves the value held by the flip-flop 161. The adders 170 to 177 subtract the output value from the shift circuit 169 from the values held by the flip-flops 161 to 168 to obtain new metric values, thus preventing an overflow of metric values.

The compare-select unit 122 executes an add process that adds a branch metric at the current time to a metric at the previous time, compares the sum with the metric value at the previous time, and selects a metric with a large likelihood. Likewise, in case of PR(1221), we have:

$$M0\_0(k+1)=\text{Min}(M0\_0(k), M4(k))+BM00$$

$$M0\_1(k+1)=\text{Min}(M0\_0(k), M4(k))+BM01$$

$$M1(k+1)=\text{Min}(M0\_1(k), M4(k))+BM1$$

$$M3(k+1)=M1(k)$$

$$M4(k+1)=M6(k)$$

$$M6(k+1)=\text{Min}(M3(k), M7\_0(k))+BM6$$

$$M7\_0(k+1)=\text{Min}(M3(k), M7\_1(k))+BM70$$

$$M7\_1(k+1)=\text{Min}(M3(k), M7\_1(k))+BM71$$

The path memory 123 stores the select result of the compare-select unit 122 for a predetermined period of time, and outputs it as final binary data after an elapse of the predetermined period of time.

Figure 1:
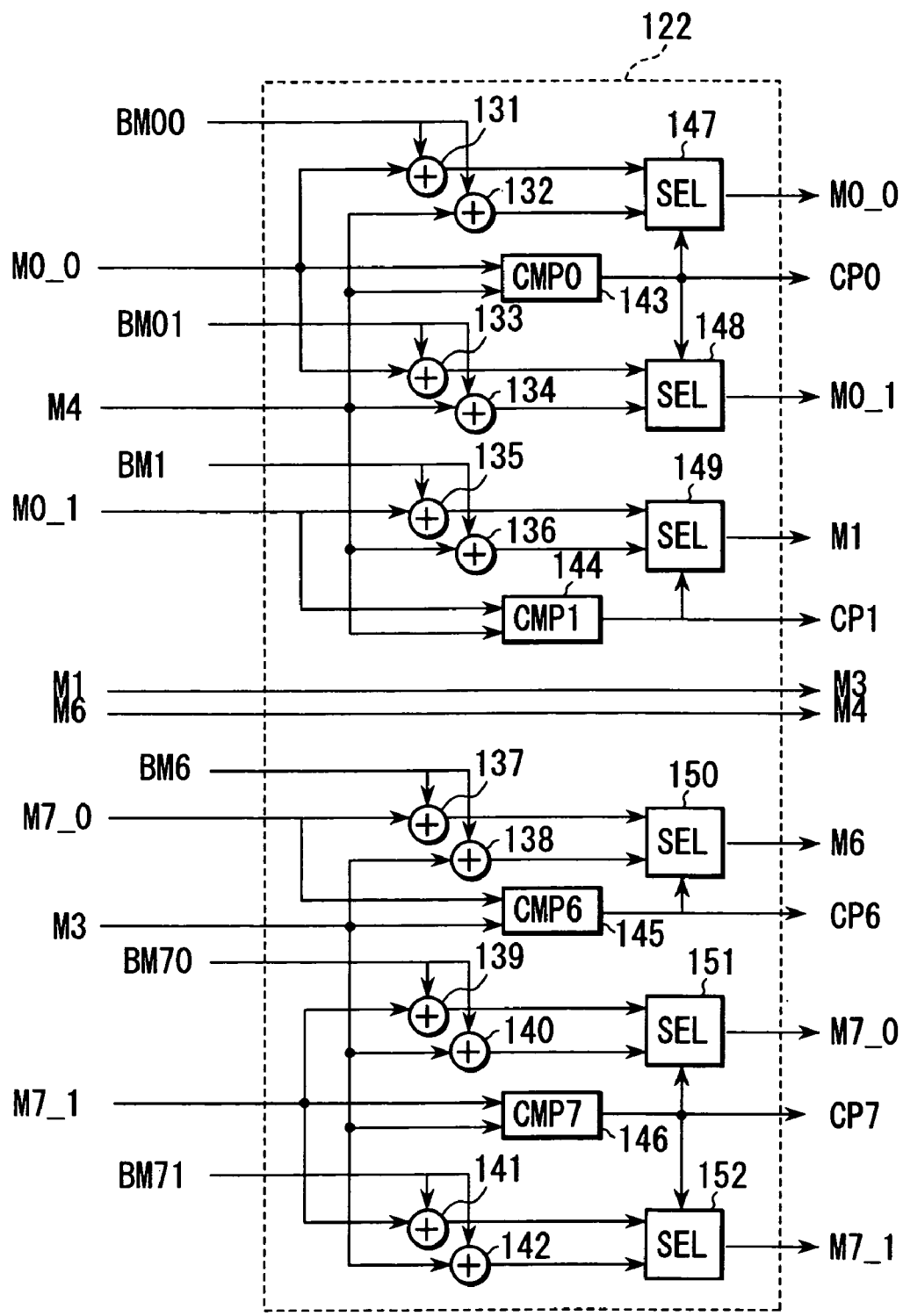
FIG. 1 is a circuit diagram showing the structure of an Add-Compare-Select unit according to an embodiment of the present invention.

The internal structure of an add-compare-select (ACS) unit of the Viterbi decoder corresponding to PR(1221) according to the present invention will be described below using FIG. 1. Referring to FIG. 1, reference symbols BM00, BM01, BM1, BM6, BM70, and BM71 denote branch metric values, i.e., the output signals of the branch metric operating unit 121. Reference symbols M0_0, M0_1, M1, M4, M6, M7_0, M3, and M7_1 denote metric values, i.e., the output signals of the metric register 124.

As shown in FIG. 1, the Viterbi decoder (ACS unit) 122 comprises adders 131 to 142, comparators 143 to 146, and selectors 147 to 152.

Each of the adders 131 to 142 computes the sum of two input values. Each of the comparators 143 to 146 compares two input values. Each of the selectors 147 to 152 outputs one of two input values on the basis of the comparison result of the corresponding one of the comparators 143 to 146.

A combination of the adders 131 and 132, comparator 143, and selector 147 implements the following compare-select process.

$$M0\_0(k+1)=\text{Min}(M0\_0(k), M4(k))+BM00$$

Likewise, a combination of the adders 133 and 134, comparator 143, and selector 148 implements the following compare-select process.

$$M0\_1(k+1)=\text{Min}(M0\_0(k), M4(k))+BM01$$

A combination of the adders 135 and 136, comparator 144, and selector 149 implements the following compare-select process.

$$M1(k+1)=\text{Min}(M0\_1(k), M4(k))+BM1$$

A combination of the adders 137 and 138, comparator 145, and selector 150 implements the following compare-select process.

$$M6(k+1)=\text{Min}(M3(k), M7\_0(k))+BM6$$

A combination of the adders 139 and 140, comparator 146, and selector 151 implements the following compare-select process.

$$M7\_0(k+1)=\text{Min}(M3(k), M7\_1(k))+BM70$$

A combination of the adders 141 and 142, comparator 147, and selector 152 implements the following compare-select process.

$$M7\_1(k+1)=\text{Min}(M3(k), M7\_1(k))+BM71$$

The outputs from the selectors 147 to 152 become input signals to the metric register 124 as new metric values. The outputs from the comparators 143 to 146, i.e., comparison results become input signals to the path memory 123.

In this manner, the compare-select processes of the Viterbi decoder according to the present invention are executed.

Figure 13:
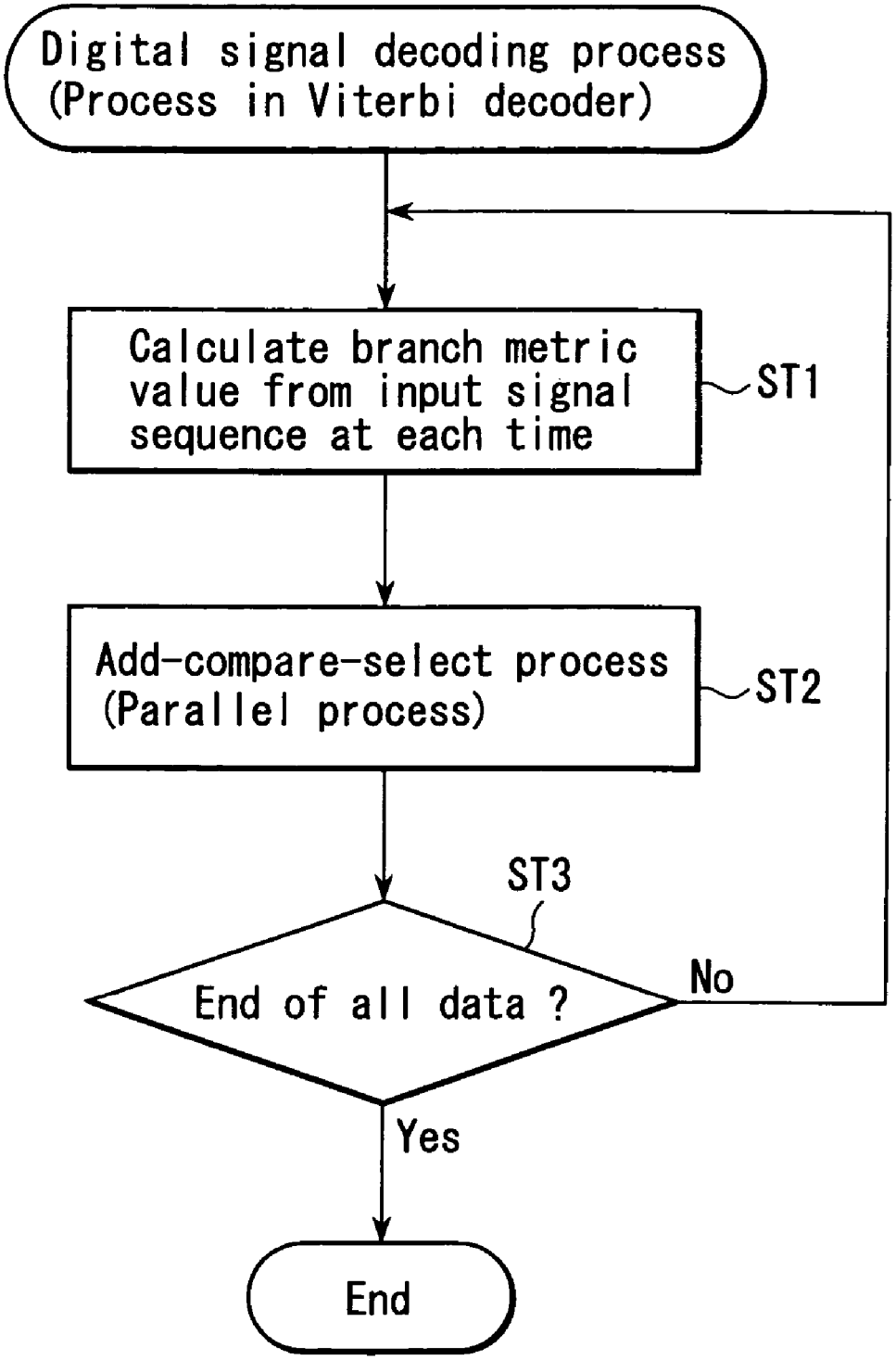
FIG. 13 is a flow chart for explaining an outline of a digital signal decoding method according to an embodiment of the present invention.

FIG. 13 summarizes the processes of principal part of the digital signal decoding method of the present invention. That is, the processes of the branch metric operating unit 121 and compare-select unit 122 will be summarized below. As shown in FIG. 13, the branch metric operating unit 121 calculates branch metric values (BM00, BM01, BM1, BM6, BM70, and BM71) from an input signal sequence at each time (ST1). The compare-select unit 122 executes add-compare-select (ACS) processes on the basis of the calculation results of the branch metric operating unit 121 (ST2). That is, the unit 122 compares two metric values (e.g., M0_0 and M4) one unit time before the calculation time of a predetermined branch metric value (e.g., BM00), adds the predetermined branch metric value (e.g., BM00) to these two metric values (e.g., M0_0 and M4) independently of this compare process, selects one of the two sums (e.g., the selector 147) in accordance with the comparison results of the two metric values (e.g., the output from the comparator 143), and outputs the selected value as a metric value to be used at the next time.

More specifically, the unit 122 parallelly executes the following first and second processes. The first process compares two metric values (e.g., M0_0 and M4) one unit time before the calculation time of a first branch metric value (e.g., BM00) of a plurality of branch metric values (e.g., BM00, BM01) divided under a predetermined condition (e.g., the comparator 143), adds the first branch metric value (e.g., BM00) to these two metric values (e.g., M0_0 and M4) independently of this compare process, selects one of the two sums (e.g., the selector 147) in accordance with the comparison result of the two metric values (e.g., the output from the comparator 143), and outputs the selected value as a metric value to be used at the next time.

The second process compares only two metric values (e.g., M0_0 and M4) one unit time before the calculation time of a second branch metric value (e.g., BM01) of the plurality of branch metric values (e.g., BM00, BM01) divided under the predetermined condition (e.g., the comparator 143), adds the second branch metric value (e.g., BM01) to these two metric values (e.g., M0_0 and M4) independently of this compare process, selects one of the two sums (e.g., the selector 148) in accordance with the comparison result of the two metric values (e.g., the output from the comparator 143), and outputs the selected value as a metric value to be used at the next time.

The aforementioned first and second processes are repeated at each time.

In the above embodiment, PR(1221) has been exemplified. However, the present invention is not limited to this, and can be similarly applied to partial responses of other classes. The present invention has the following points. That is, a simple trellis diagram that has undergone the Transform process is generated in the first step. If the generated trellis diagram has a branch metric with a weight, the diagram is changed to divide that branch metric into two states, which parallelly undergo ACS processes, in the second step. By configuring hardware in accordance with the trellis diagram generated in this way, a Viterbi decoder which can attain both high-speed processes and low power consumption can be implemented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A digital signal decoding device for generating a binary code sequence by maximum likelihood estimation from a convolutionally encoded input signal sequence, comprising:
   a calculation unit configured to calculate a branch metric value from the input signal sequence; and
   an add-compare-select unit configured to compare only two metric values one unit time before a calculation time of a predetermined branch metric value, to add the predetermined branch metric value to the two metric values independently of the compare process, to select one of the two sums in accordance with the comparison result of the two metric values, and to output the selected value as a metric value to be used at the next time.

2. A device according to claim 1, wherein the add-compare-select unit parallelly executes:
   a first process for comparing only two metric values one unit time before a calculation time of a first branch metric value of a plurality of branch metric values divided under a predetermined condition, adding the first branch metric value to the two metric values independently of the compare process, selecting one of the two sums in accordance with the comparison result of the two metric values, and outputting the selected value as a metric value to be used at the next time; and
   a second process for comparing only two metric values one unit time before a calculation time of a second branch metric value of the plurality of branch metric values divided under the predetermined condition, adding the second branch metric value to the two metric values independently of the compare process, selecting one of the two sums in accordance with the comparison result of the two metric values, and outputting the selected value as a metric value to be used at the next time.

3. A device according to claim 1, wherein the add-compare-select unit comprises:
   a first add unit configured to add a first branch metric value to a first metric value one unit time before;
   a second add unit configured to add the first branch metric value to a second metric value one unit time before;
   a third add unit configured to add a second branch metric value to the first metric value one unit time before;
   a fourth add unit configured to add the second branch metric value to the second metric value one unit time before;
   a compare unit configured to compare only the first and second metric values, and to output one of the first and second metric values;
   a first select unit configured to select one of the sums calculated by the first and second add units in accordance with the comparison result of the compare unit, and to output the selected value as a first metric value used at the next time; and
   a second select unit configured to select one of the sums calculated by the third and fourth add units in accordance with the comparison result of the compare unit, and to output the selected value as a second metric value used at the next time.

4. A digital signal decoding method for generating a binary code sequence by maximum likelihood estimation from a convolutionally encoded input signal sequence, comprising:
   comparing only two metric values one unit time before a calculation time of a predetermined branch metric value calculated from the input signal sequence, adding the predetermined branch metric value to the two metric values independently of the compare process, selecting one of the two sums in accordance with the comparison result of the two metric values, and outputting the selected value as a metric value to be used at the next time.

5. A method according to claim 4, wherein the method parallelly executes:
   a first process for comparing only two metric values one unit time before a calculation time of a first branch metric value of a plurality of branch metric values divided under a predetermined condition, adding the first branch metric value to the two metric values independently of the compare process, selecting one of the two sums in accordance with the comparison result of the two metric values, and outputting the selected value as a metric value to be used at the next time; and
   a second process for comparing only two metric values one unit time before a calculation time of a second branch metric value of the plurality of branch metric values divided under the predetermined condition, adding the second branch metric value to the two metric values independently of the compare process, selecting one of the two sums in accordance with the comparison result of the two metric values, and outputting the selected value as a metric value to be used at the next time.

* * * * *